US011160163B2

(12) United States Patent
Sinha et al.

(10) Patent No.: US 11,160,163 B2
(45) Date of Patent: Oct. 26, 2021

(54) ELECTRONIC SUBSTRATE HAVING DIFFERENTIAL COAXIAL VIAS

(71) Applicant: Texas Instruments Incorporated, Dallas, TX (US)

(72) Inventors: Snehamay Sinha, Plano, TX (US); Tapobrata Bandyopadhyay, Dallas, TX (US); Makarand Ramkrishna Kulkarni, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 43 days.

(21) Appl. No.: 15/816,667

(22) Filed: Nov. 17, 2017

(65) Prior Publication Data

US 2019/0159333 A1    May 23, 2019

(51) Int. Cl.
| | | |
|---|---|---|
| *H05K 1/00* | (2006.01) | |
| *H05K 1/02* | (2006.01) | |
| *H05K 1/11* | (2006.01) | |
| *H01L 21/02* | (2006.01) | |
| *H05K 3/42* | (2006.01) | |
| *H01L 23/06* | (2006.01) | |

(52) U.S. Cl.
CPC ..... *H05K 1/0221* (2013.01); *H01L 21/02008* (2013.01); *H01L 23/06* (2013.01); *H05K 1/0222* (2013.01); *H05K 1/0245* (2013.01); *H05K 1/115* (2013.01); *H05K 3/42* (2013.01)

(58) Field of Classification Search
CPC .... H05K 1/0221; H05K 1/0222; H05K 1/115; H05K 1/0245; H05K 3/42; H01L 21/02008; H01L 23/06
See application file for complete search history.

(56) References Cited

U.S. PATENT DOCUMENTS

| 5,522,132 A | 6/1996 | Mattei | |
|---|---|---|---|
| 7,239,222 B2 * | 7/2007 | Nagaishi | H01L 23/552 257/E23.114 |
| 7,317,166 B2 * | 1/2008 | Nakamura | H05K 1/0222 174/254 |

(Continued)

FOREIGN PATENT DOCUMENTS

WO    2017039631 A1    3/2017

OTHER PUBLICATIONS

International Search Report for PCT/US2018/061784 dated Mar. 21, 2019.

*Primary Examiner* — Pete T Lee
(74) *Attorney, Agent, or Firm* — Charles F. Koch; Charles A. Brill; Frank D. Cimino

(57) ABSTRACT

An electronic substrate includes a dielectric core, a first conducting layer on a first side of the core and a second conducting layer on the second side of the core opposite the first side. At least one differential coaxial through-via includes a first inner signal through-via that is at least electrical conductor lined for a first signal path and at least a second inner signal through-via that is also at least electrical conductor lined positioned side-by-side and being dielectrically isolated from the first inner signal through-via for a second signal path. An annular-shaped outer ground shield enclosure is at least conductor lined that surrounds and is dielectrically isolated from both the first and second inner signal through-vias.

17 Claims, 4 Drawing Sheets

(56) References Cited

U.S. PATENT DOCUMENTS

| | | | |
|---|---|---|---|
| 7,420,126 B2* | 9/2008 | Shibata | H05K 3/445 |
| | | | 174/252 |
| 7,728,234 B2* | 6/2010 | Wang | H05K 3/207 |
| | | | 174/262 |
| 7,838,779 B2* | 11/2010 | Yamamichi | H01L 24/32 |
| | | | 174/264 |
| 8,273,995 B2 | 9/2012 | Chandrasekraran | |
| 8,304,666 B2* | 11/2012 | Ko | H05K 1/0222 |
| | | | 174/262 |
| 9,578,755 B2* | 2/2017 | Mizutani | H05K 3/4602 |
| 2001/0001292 A1 | 5/2001 | Bertin et al. | |
| 2005/0139390 A1 | 6/2005 | Kim et al. | |
| 2008/0185180 A1 | 8/2008 | Cheng et al. | |
| 2011/0005824 A1* | 1/2011 | An | H05K 3/4658 |
| | | | 174/261 |
| 2012/0258589 A1 | 10/2012 | Volant et al. | |
| 2014/0069706 A1 | 3/2014 | Unno et al. | |
| 2015/0305157 A1* | 10/2015 | Yoshimura | H05K 3/445 |
| | | | 174/266 |
| 2016/0181189 A1 | 6/2016 | Qian et al. | |

* cited by examiner

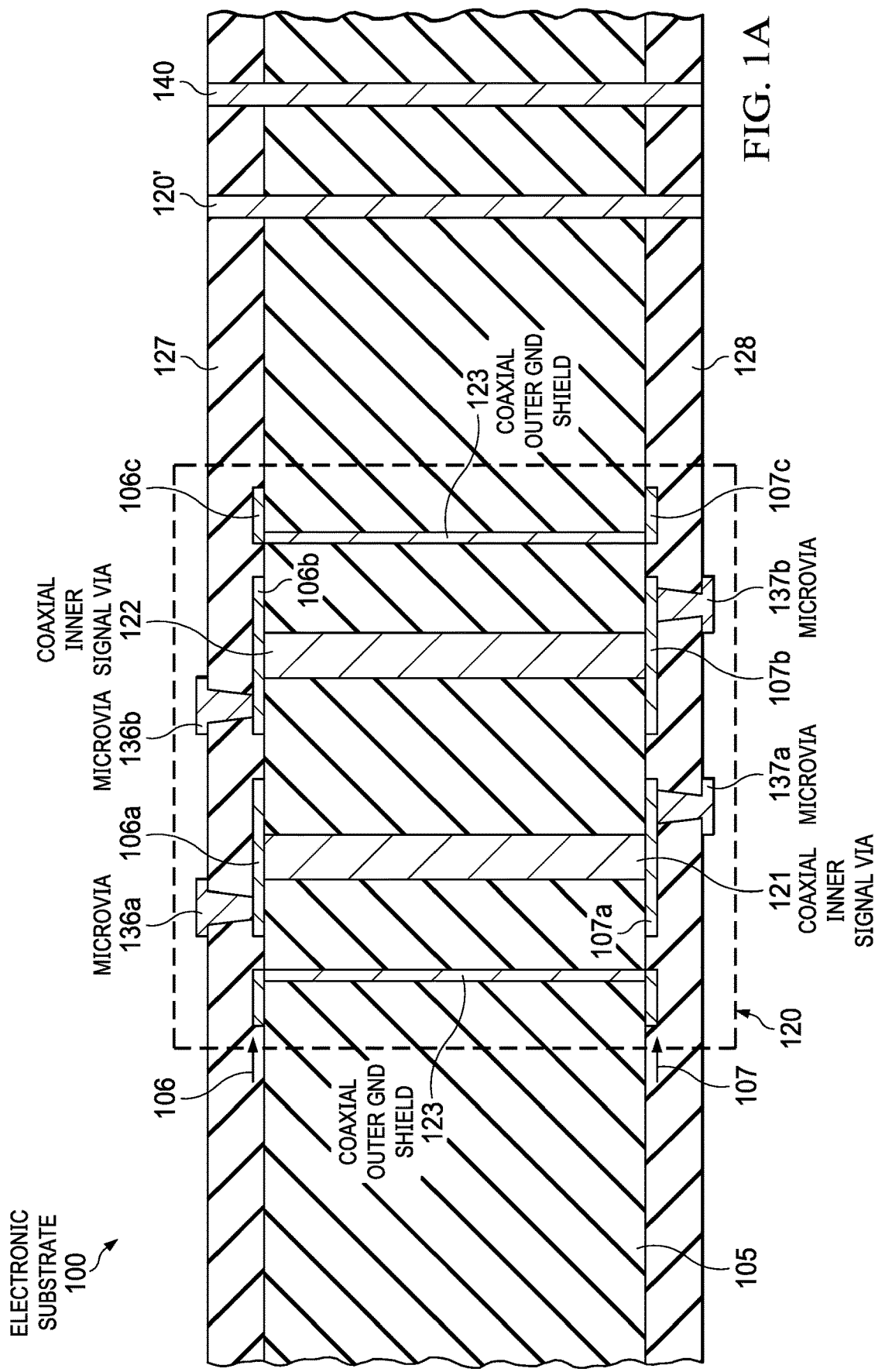

ELECTRONIC SUBSTRATE HAVING DIFFERENTIAL COAXIAL VIAS

FIELD

This Disclosure relates to via arrangements for electronic substrates such as printed circuit boards (PCBs) or IC packages for electronic devices.

BACKGROUND

A PCB as known in the art mechanically supports and electrically connects electronic components mounted thereon using conductive tracks, pads and other features etched from generally copper sheets laminated onto at least one side of a dielectric substrate material (hereafter a 'dielectric core') to provide an electronic device (e.g., Central Processing Unit (CPU) or a graphic chip set). A double-sided PCB only has two electrically conductive layers of material, while multilayer PCBs have at least three layers of conductive material including at least one conductive layer between the PCB core and a prepeg layer. Prepeg and PCB core are essentially the same materials, but the prepeg is not fully cured making it more malleable as compared to the PCB core. Electrical components (e.g. capacitors, resistors, transistors, or an IC chip) are generally soldered on the PCB, in some cases soldered on both sides of the board. PCBs also generally include vias such as through-vias that extend from one side of the PCB core to the other. Advanced PCBs may also include some components embedded within the dielectric core.

An IC package (or chip package) like a PCB includes a dielectric core (sometimes referred to in the art as a 'package core'), and generally also includes through-vias, where an IC chip is generally mounted on the top side of the IC package. One example IC package is a flip-chip (FC) bonding package, and another example package is a plastic wire bond ball grid array (PBGA) package. Yet another IC package arrangement is a package substrate that is configured for positioning between a FC die and an interposer.

Vias as known in the art are at least conductor (e.g., copper) lined holes which couple conductive layers of a multilayer substrate, such as for a multilayer PCB or an IC package. The most common via types are conductor lined through-vias known as a plating through hole (PTH) via, a via that is open only on one side known as a blind hole via, and an embedded via known as a buried hole via. Some circuit designs benefit from having the through-vias filled rather than a PTH that leaves them open on the surface of the PCB or package IC after the plating process. Filling of vias can be achieved with fill materials such as epoxy, paste, plating with copper, or tenting with solder mask. Such vias on the electronic device are used for signals, for power, and for ground.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize standard through-vias (PTH vias or filled through-vias) in PCB or package IC-based electronic devices used for signals can lead to signal crosstalk issues particularly in high density PCBs or IC packages. Crosstalk can cause device problems such as for high-speed interface devices including for a Serializer/Deserializer (SerDes) or for a universal serial bus (USB) interface. The crosstalk can lead to poor device signal integrity and thus data conversion errors, leading to serious performance problems for the interface device.

The traditional PCB and package IC approach to reduce via-via crosstalk is to either increase the via-via distance or to add ground vias between and surrounding the signal vias. Both of these traditional approaches for reducing via-via crosstalk lead to a reduced signal via density in the PCB or package IC-based electronic device.

Disclosed aspects include an electronic substrate comprising a dielectric core, a first conducting layer on a first side of the dielectric core and a second conducting layer on the second side of the core opposite the first side. At least one differential coaxial through-via includes a first inner signal through-via that is at least conductor lined for a first signal path and at least a second inner signal through-via that is also at least conductor lined positioned side-by-side and being dielectrically isolated from the first inner signal through-via for a second signal path. An annular-shaped outer ground shield enclosure that is at least conductor lined surrounds and is dielectrically isolated from both the first and second inner signal through-vias.

BRIEF DESCRIPTION OF THE DRAWINGS

Reference will now be made to the accompanying drawings, which are not necessarily drawn to scale, wherein:

FIG. 1A is a side view of an example electronic substrate having a disclosed differential coaxial signal via shown comprising first and second filled inner signal through-vias that are both surrounded by an outer ground shield enclosure.

DETAILED DESCRIPTION

Figure 1B:
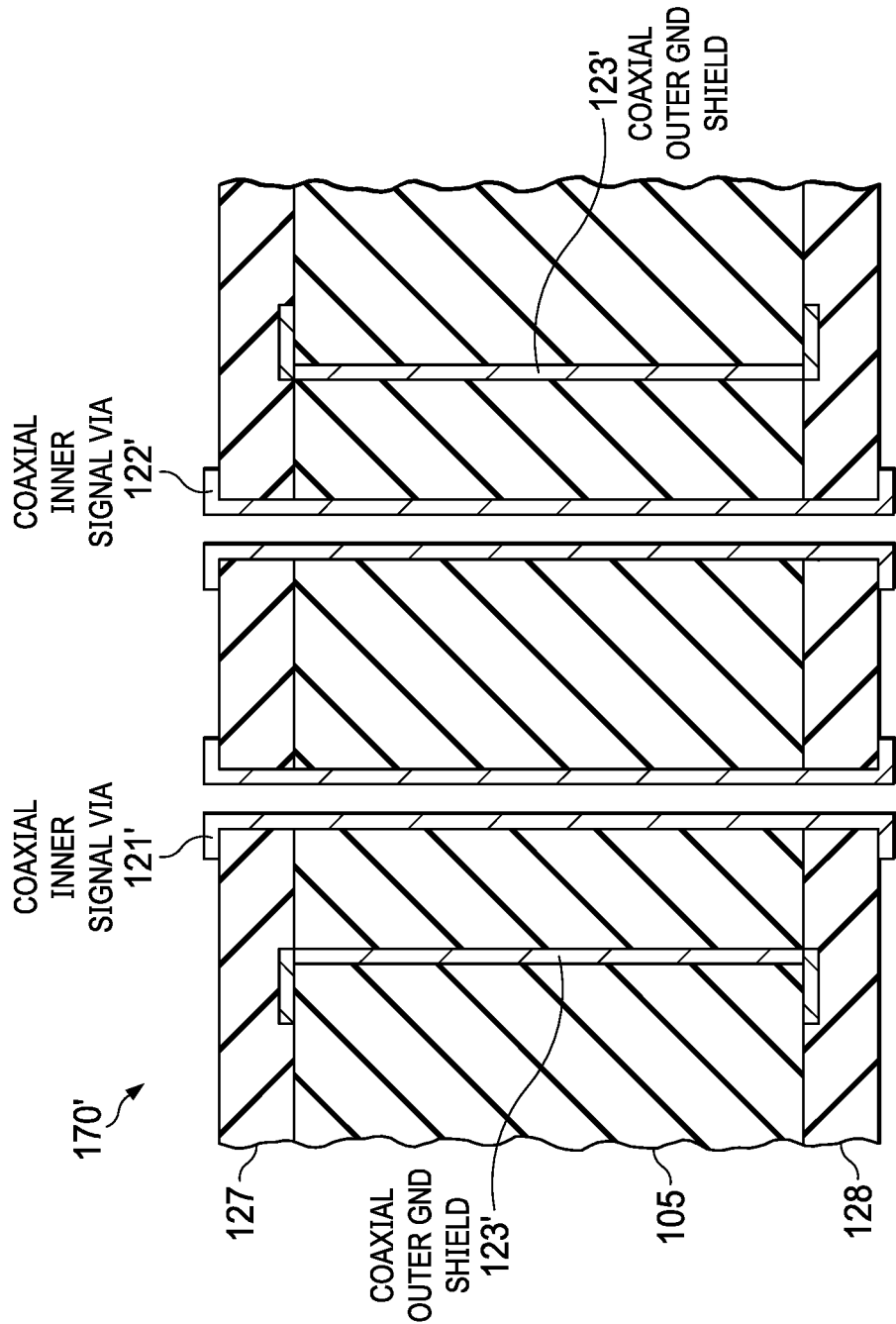
FIG. 1B is a side view of an example electronic differential coaxial via comprising a first inner signal through-via and a second inner signal through-via that are each surrounded by an outer ground shield enclosure, where there are first and second inner signal through-vias are PTH vias that extend from the top surface of the top side dielectric layer to the bottom surface of the bottom side dielectric layer, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1A is a side view of an example electronic substrate 100 comprising a dielectric core 105 having a disclosed differential coaxial via 120 comprising a first inner signal through-via 121 and a second inner signal through-via 122 that are each surrounded by an outer ground shield enclosure 123, according to an example aspect. In this aspect the microvias 136a, 136b, 137a, 137b are offset from the inner signal through-vias 121, 122 by traces including first top side contact 106a, second top side contact 106b, first bottom side contact 107a, and a second bottom side contact 107b. The electronic substrate 100 can be an IC package or a PCB.

The dielectric core 105 can comprise epoxy resin for example. In the case the electronic substrate 100 comprises a PCB, the PCB can generally comprise any multilayer substrate such as a buildup or laminate multilayer PCB, or a buildup or laminate package substrate. As known in the art a conventional multilayer PCB can be prepared by building up a two-sided core laminate with one or more layers of single-sided laminate added to each side of the core laminate. Examples of dielectric materials used in laminates include, but are not limited to, FR-2 phenolic cotton paper, FR-4 woven glass and epoxy resin, G-10 woven glass and epoxy, CEM-1 cotton paper and epoxy, CEM-3 woven glass and epoxy, CEM-5 woven glass and polyester, polyimide, and other dielectric materials typically used in preparing multilayer substrates.

Another disclosed differential coaxial signal via is shown in FIG. 1A without details as 120' to represent there will generally be a plurality of differential coaxial through-vias in the electronic substrate 100. Although not shown, the conductor of the outer ground shield enclosure 123 will be coupled to a ground terminal on the electronic substrate 100. In device applications, the inner signal through-vias 121 and 122 are generally both connected to couple different signals received from one side of the electronic substrate 100 to the other side to support differential signaling for interface devices such as a Serializer/Deserializer (SerDes) or a Universal Serial Bus (USB), while standard through-signal vias with a standard via shown in FIG. 1A as 140 will generally be used for the non-differential signal coupling from one side of the electronic substrate 100 to the other side including for power, for ground, and for single-ended signals. SerDes as known in the art is a pair of functional blocks commonly used in high speed communications to compensate for limited input/output which convert data between serial data and parallel interfaces in each direction.

Disclosed inner signal through-vias 121 and 122 in FIG. 1A (or 121' and 122' in FIG. 1B described below) being surrounded by dielectric material and being within the outer ground shield 123 (or outer ground shield 123' in FIG. 1B described below) can significantly reduce the crosstalk. Crosstalk is reduced between the through-vias in the differential coaxial through-vias 120 and the through-vias of the differential coaxial signal via 120', and between the differential coaxial through vias (120 and 120') and standard through-signal via 140 in FIG. 1A. This reduced crosstalk leads to improved signal integrity by providing a controlled path for the return current flow. Reduced crosstalk also leads to better impedance matching in the inner signal through-vias 121 and 122 (or 121' and 122') which provides improved signal integrity for the respective signals.

Electronic substrate 100 is shown including a first electrically conducting layer 106 on its top side and a second electrically conducting layer 107 on its bottom side. The first electrically conducting layer 106 is shown providing a first top side contact 106a over and extending beyond the first inner signal through-via 121, and also a second top side contact 106b over and extending beyond the second inner signal through-via 122, and a ground top side contact 106c shown over and extending beyond the ground shield 123. The second electrically conducting layer 107 is shown providing a first bottom side contact 107a over and extending beyond the first inner signal through-via 121, and a second bottom contact 107b over and extending beyond the second inner signal through-via 122, and a ground bottom side contact 107c shown over and extending beyond the outer ground shield 123.

Also shown in FIG. 1A is a top side dielectric layer 127 on the top side and a bottom side dielectric layer 128 is on the bottom side. The top side dielectric layer 127 and bottom side dielectric layer 128 can comprise a prepeg layer for a PCB or a build-up dielectric layer for an IC package. A first top side microvia 136a provides top side contacts extending through the top side dielectric layer 127 to contact the first top side contact 106a, and a second top side microvia 136b provides top side contacts extending through the top side dielectric layer 127 to contact the second top side contact 106b. A first bottom side microvia 137a provides bottom side contact extending through the bottom side dielectric layer 128 to contact the first bottom side contact 107a, and a second bottom side microvia 137b provides bottom side contacts by extending through the bottom side dielectric layer 128 to contact the second bottom side contact 107b. As used herein, a 'microvia' is a through-via through a build-up dielectric layer such as the top side dielectric layer 127 and bottom side dielectric layer 128, whereas the inner signal through-vias 121, 122 are vias in contrast that are through only the dielectric core 105 of the PCB or IC package.

FIG. 1B is a side view of an example electronic differential coaxial via 170' comprising a first inner signal through-via 121' and a second inner signal through-via 122' that are each surrounded by an outer ground shield enclosure 123', according to an example aspect. There are first and second inner signal through-vias are PTH vias that extend from the top surface of the top side dielectric layer 127 to the bottom surface of the bottom side dielectric layer 128. In this aspect there are no microvias or top and bottom side micro via pads.

The minimum spacing range between the closest edges of inner signal through-vias 121, 122 (or 121', 122') and the distance range of the closest edge of the inner signal through-vias 121, 122 (or 121', 122') to the outer ground shield enclosure 123 (or 123') depends on the impedance requirements of the interface device, the technology/process limitations, package or PCB substrate, and dielectric constant of the dielectric core 105. For example, these spacings can be a few microns for a packaged IC to a few hundred microns for a PCB.

Figure 2A:
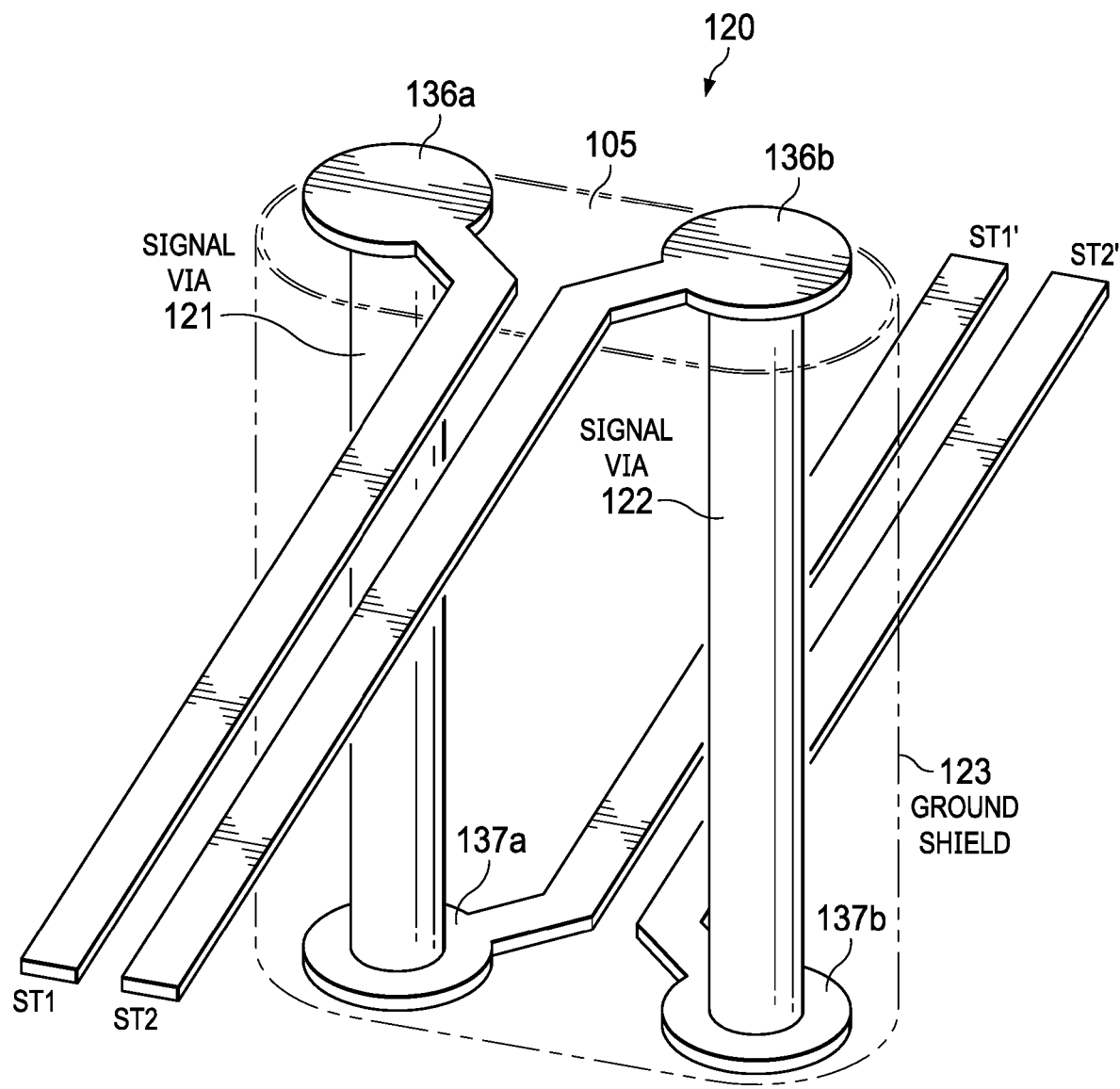
FIG. 2A is a 3-D view of a disclosed differential coaxial via.
Figure 2B:
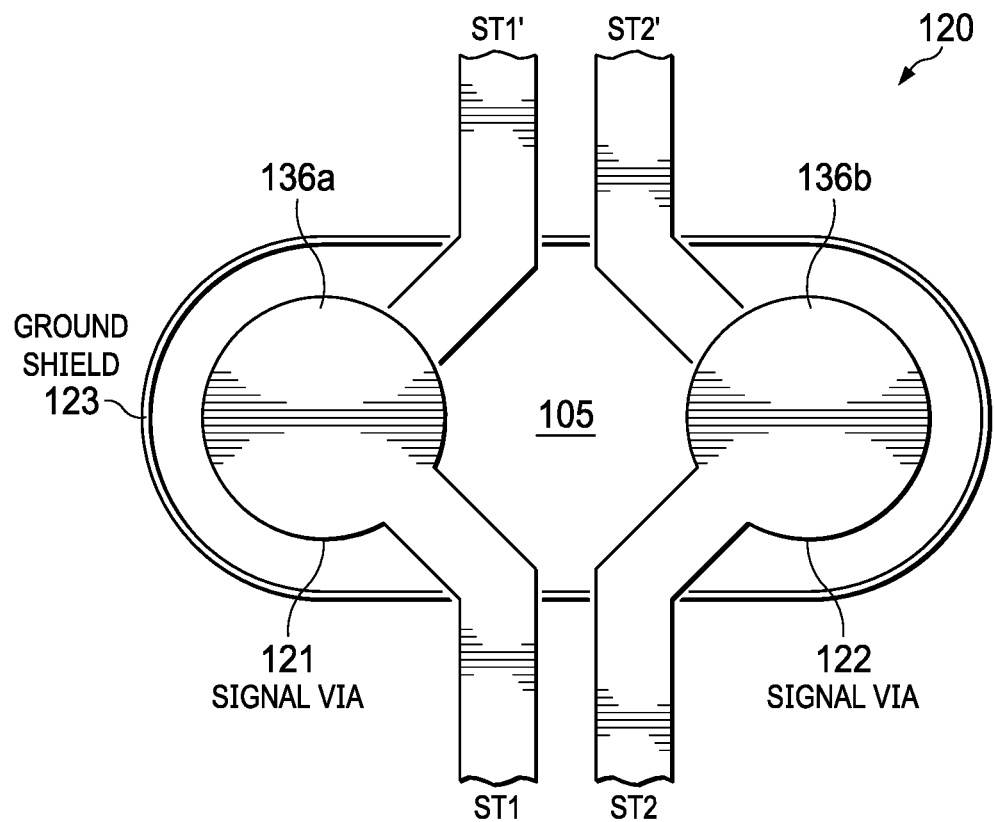
FIG. 2B is a top view of the differential coaxial via shown in FIG. 2A, according to an example aspect.

FIG. 2A is a 3-D view of the differential coaxial via 120 shown in FIG. 1A, and FIG. 2B is a top view of the differential coaxial via 120 shown in FIG. 1A/FIG. 2A, according to an example aspect. On the top side can be seen to be the first top side microvia 136a that is coupled to the inner signal through-via 121 and the second top side microvia 136b that is coupled to the inner signal through-via 122. Signal traces on the same level as the top microvias shown as $ST_1$ is coupled to first top side microvia 136a and shown as $ST_2$ is coupled to the second top side microvia 136b. Signal traces on the same level as the bottom microvias shown as $ST_1$ is coupled to the first bottom side microvia 137*a*, and $ST_2$, is coupled to the second bottom side microvia 137*b*.

Figure 3:
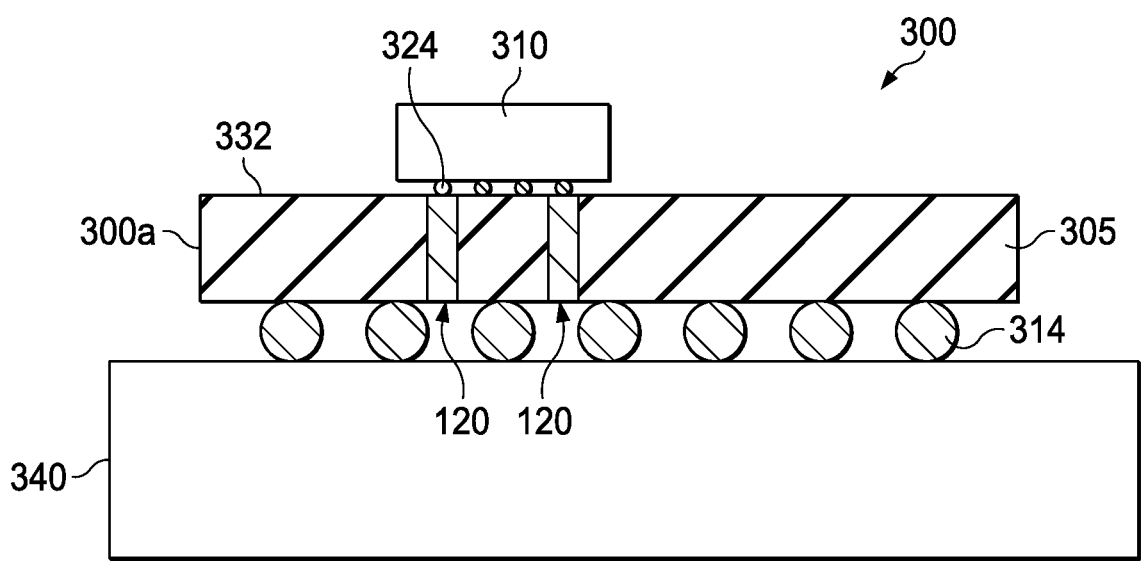
FIG. 3 shows a cross-section side view of an example IC assembly shown as a FC bonding package having at least one disclosed differential coaxial signal via, according to an example aspect.

FIG. 3 shows a cross-section side view of an example IC assembly 300 including a FC bonding package 300*a* comprising a dielectric core 305 having at least one disclosed differential coaxial signal via 120 therein, according to an example aspect. The IC assembly can alternatively be a wire bonded (WB) package. An IC die 310 is included that generally comprises an interface device is on the FC bonding package 300*a*. In some aspects, IC assembly 300 may include two or more IC die that may be electrically and/or physically coupled by the FC bonding package 300*a*. The FC bonding package 300*a* is shown mounted on an interposer or a PCB 340.

The IC die 310 may include or be a part of a processor, memory, switch, application specific IC (ASIC), or system-on-a-chip (SoC). In the FC configuration shown, the IC die 310 may be coupled to a top surface 332 of the FC bonding package 300*a*. In typical aspects, the electrical signals include differential signals, input/output (I/O) signals, power, and ground associated with operation of the IC die 310.

The BGA interconnect structures depicted by solder balls 314 and 324 are only meant to be example interconnect structures. In other aspects, a land-grid array (LGA) structure may electrically couple one or more lands on bonding package 300*a* with one or more pads on interposer or PCB 340, which may route electrical signals between bonding package 300*a* and the interposer or PCB 340. In the case of a WB package, there will be bond wire instead of solder balls.

Regarding fabrication of a disclosed electronic substrate having at least one disclosed differential coaxial via 120, and an annular shape ground through-cut for the outer ground shield enclosure 123 can be prepared by a method that comprises forming a through-hole pattern having a shape of the hole being circular, oval, or rectangle-like with two semicircles at the ends through-holes through a dielectric core 105. This is followed by lining the ground through-cut with an electrical conductor (e.g., metalizing).

The annular shape ground through-cut can be made by punching with an elongated punch, drilling multiple overlapping holes in proximity to each other or lasing the desired elongated shape, depending on considerations such as the shape and size of the hole and convenience. The annular shape ground through-cut can be lined by being plated, or metalized, by sputtering or electroplating. For example, electroless copper can be applied, followed by electrolytic copper. Other metals that can be applied during the sputtering and/or plating process include, but are not limited to, nickel, gold, palladium, or silver. Alternatively, the through-hole vias can be lined with an electrically conducting organic polymer such as polyacetylene, polypyrrole, or polyaniline.

The annular-shaped through-cut is then filled by depositing a differential signal through-via are then prepared by forming through-holes through dielectric material. These signal through-vias can as with the annular shape ground through-cut can be made by punching, drilling, or lasing. The signal through-vias are then filled or at least lined with a conductor in the same manner as the through-vias of the annular shape ground through-cut described above.

Disclosed electronic substrates do not require additional ground vias in the dielectric core 105 or 305 to reduce crosstalk or to increase signal via spacing. This helps in simplifying the electronic substrate routing and removes the potential need to increase package size and/or package layer count.

Disclosed aspects can be integrated into a variety of assembly flows to form a variety of different IC-based electronic devices and related products. The electronic devices can comprise a single IC die or multiple IC die, such as PoP configurations comprising a plurality of stacked IC die. The IC die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS. A variety of dielectric core materials may be used. In some aspects, one or both of the dielectric core 105 and the electronic substrate 100 may be formed from a rigid and/or inflexible material.

Those skilled in the art to which this disclosure relates will appreciate that many other aspects and variations of aspects are possible within the scope of the claimed invention, and further additions, deletions, substitutions and modifications may be made to the described aspects without departing from the scope of this Disclosure.

The invention claimed is:

1. An electronic substrate, comprising:
   a ground terminal;
   a dielectric core including a first surface and a second surface opposite said first surface, wherein the dielectric core includes a dielectric constant;
   a first dielectric layer physically contacting said first surface;
   a second dielectric layer physically contacting said second surface; and
   at least one differential coaxial through-via comprising:
      a first inner signal through-via that is at least conductor lined for a first signal path;
      at least a second inner signal through-via that is at least conductor lined positioned side-by-side and being dielectrically isolated from said first inner signal through-via for a second signal path;
      an annular-shaped outer ground shield enclosure that is coupled to the ground terminal and that is at least conductor lined that surrounds and is dielectrically isolated from both said first inner signal through-via and said second inner signal through-via, said annular-shaped outer ground shield enclosure including:
         a coaxial ground shield parallel to said differential coaxial through-via extending from said first surface to said second surface, said coaxial ground shield including an inner face and an outer face opposite of said inner face, said inner face concave and said outer face convex, wherein a first minimum distance between the inner face and the first inner signal through-via and a second minimum distance between the inner face and the second inner signal through-via are each based on the dielectric constant;
         a first ground contact electrically connected to said inner face, said first ground contact extending radially outward from said coaxial ground shield and disposed on said first surface; and
         a second ground contact electrically connected to said inner face, said second ground contact extending radially outward from said coaxial ground shield and disposed on said second surface;
a first contact over the first inner signal through-via and extending beyond said first inner signal through-via along the first surface of the dielectric core; and
a second contact over the first inner signal through-via and extending beyond said first inner signal through-via along the second surface of the dielectric core.

2. The electronic substrate of claim 1, wherein said electronic substrate comprises a printed circuit board (PCB).

3. The electronic substrate of claim 1, wherein said electronic substrate comprises an integrated circuit (IC) package.

4. The electronic substrate of claim 1, wherein said at least one differential coaxial via comprises a plurality of said differential coaxial through-vias.

5. The electronic substrate of claim 1, further comprising:
a first microvia providing a contact extending through said first dielectric layer to contact said first contact; and
a second microvia providing a contact extending through said second dielectric layer to contact said second contact.

6. The electronic substrate of claim 5, wherein said microvias are offset by traces from said inner signal through-vias.

7. The electronic substrate of claim 1, wherein a dielectric material within said annular-shaped outer ground shield enclosure comprises a dielectric fill material that is different from a material of said dielectric core.

8. An integrated circuit (IC) assembly, comprising:
a ground terminal;
a dielectric core including a first surface and a second surface opposite said first surface, wherein the dielectric core includes a dielectric constant;
a first dielectric layer physically contacting said first surface;
a second dielectric layer physically contacting said second surface;
at least one differential coaxial through-via, comprising:
a first inner signal through-via that is at least conductor lined for a first signal path;
at least a second inner signal through-via that is at least conductor lined positioned side-by-side and being dielectrically isolated from said first inner signal through-via for a second signal path; and
an annular-shaped outer ground shield enclosure coupled to the ground terminal and comprising at least one conductor extending from said first surface to said second surface, wherein said annular-shaped outer ground shield enclosure surrounds and is dielectrically isolated from both said first inner signal through-via and said second inner signal through-via, wherein said conductor includes an inner face and an outer face opposite of said inner face, said inner face concave and said outer face convex, wherein a first minimum distance between the inner face and the first inner signal through-via and a second minimum distance between the inner face and the second inner signal through-via are each based on the dielectric constant, said annular-shaped outer ground shield enclosure including:
a first ground contact electrically connected to said inner face, extending radially outward from said conductor, and disposed on said first surface; and
a second ground contact electrically connected to said inner face, extending radially outward from said conductor, and disposed on said second surface;
a first contact over the first inner signal through-via and extending beyond said first inner signal through-via along the first surface of the dielectric core;
a second contact over the first inner signal through-via and extending beyond said first inner signal through-via along the second surface of the dielectric core; and
an IC die coupled to said first inner signal through-via, said second inner signal through-via, and said conductor of said outer ground shield enclosure on said first surface of said dielectric core.

9. The IC assembly of claim 8, wherein said at least one differential coaxial via comprises a plurality of said differential coaxial through-vias.

10. The IC assembly of claim 8, further comprising:
a first microvia providing a contact extending through said first dielectric layer to contact said first contact; and
a second microvia providing a contact extending through said second dielectric layer to contact said second contact.

11. The IC assembly of claim 10, wherein said microvias are offset by traces from said inner signal through-vias.

12. The IC assembly of claim 8, wherein said IC die comprises an interface IC.

13. A circuit device comprising:
a ground terminal;
a dielectric core including a first surface and a second surface opposite said first surface, wherein the dielectric core includes a dielectric constant;
a first dielectric layer, wherein a first side of the first dielectric layer is physically contacting the first surface of the dielectric core;
a second dielectric layer, wherein a first side of the second dielectric layer is physically contacting the second surface of the dielectric core;
a first conductive feature extending through the dielectric core;
a second conductive feature extending through the dielectric core and extending parallel to the first conductive feature, the first conductive feature and the second conductive feature extending through the first dielectric layer and the second dielectric layer; and
a conductive shield coupled to the ground terminal and extending from the first surface to the second surface and extending parallel to the first conductive feature and the second conductive feature, wherein the conductive shield laterally surrounds a portion of the first conductive feature and a portion of the second conductive feature, and the conductive shield including:
an inner face and an outer face opposite of the first inner face, the first inner face concave and the outer face convex, wherein a first minimum distance between the inner face and the first conductive feature and a second minimum distance between the inner face and the second conductive feature are each based on the dielectric constant;
a first portion electrically connected to the inner face, extending radially outward from the conductive shield, and disposed on the first surface of the dielectric core; and
a second portion electrically connected to the inner face, extending radially outward from the conductive shield, and disposed on the second surface;

a first contact over the first conductive feature and extending beyond the first conductive feature along a second side of the first dielectric layer opposite the first side of the first dielectric layer; and a second contact over the first conductive feature and extending beyond the first conductive feature along a second side of the second dielectric layer opposite the first side of the second dielectric layer.

14. The circuit device of claim 13, wherein the dielectric core is selected from a group consisting of: a printed circuit board core and an integrated circuit package core.

15. The circuit device of claim 13, wherein:

the first conductive feature extends above and below the portion of the first conductive feature surrounded by the conductive shield; and the second conductive feature extends above and below the portion of the second conductive feature surrounded by the conductive shield.

16. The circuit device of claim 13, wherein the dielectric core is disposed between the conductive shield and the first conductive feature and disposed between the conductive shield and the second conductive feature.

17. The circuit device of claim 13, wherein the first conductive feature includes a conductive liner and a gap extending through the first conductive feature.

* * * * *